US007545154B2

(12) United States Patent
Wagner et al.

(10) Patent No.: US 7,545,154 B2
(45) Date of Patent: Jun. 9, 2009

(54) SENSOR USING THE CAPACITIVE MEASURING PRINCIPLE

(75) Inventors: Manfred Wagner, Triftern (DE); Norbert Reindl, Fürstenzell (DE)

(73) Assignee: Micro-Epsilon Messtechnik GmbH & Co. KG, Ortenburg (DE)

( * ) Notice: Subject to any disclaimer, the term of this patent is extended or adjusted under 35 U.S.C. 154(b) by 0 days.

(21) Appl. No.: 11/765,612

(22) Filed: Jun. 20, 2007

(65) Prior Publication Data

US 2008/0007274 A1 Jan. 10, 2008

Related U.S. Application Data

(63) Continuation of application No. PCT/DE2005/002105, filed on Nov. 24, 2005.

(51) Int. Cl.
*G01R 27/26* (2006.01)

(52) U.S. Cl. ...................................................... 324/663

(58) Field of Classification Search .................. 324/663
See application file for complete search history.

(56) References Cited

U.S. PATENT DOCUMENTS

| | | | | |
|---|---|---|---|---|
| 5,874,672 | A * | 2/1999 | Gerardi et al. | 73/170.26 |
| 6,346,819 | B1 * | 2/2002 | Joss et al. | 324/665 |
| 6,377,009 | B1 * | 4/2002 | Philipp | 318/468 |
| 6,977,511 | B2 * | 12/2005 | Patel et al. | 324/661 |
| 7,378,857 | B2 * | 5/2008 | Franke et al. | 324/663 |
| 2002/0067631 | A1 * | 6/2002 | Lunding et al. | 363/131 |

FOREIGN PATENT DOCUMENTS

| | | | |
|---|---|---|---|
| EP | 1 154 110 | A2 | 11/2001 |
| WO | WO 2004/038149 | A2 | 5/2004 |

OTHER PUBLICATIONS

International Preliminary Report on Patentability from PCT Appl. No. PCT/DE2005/002105, issued Jun. 26, 2007.

* cited by examiner

*Primary Examiner*—Vincent Q Nguyen
*Assistant Examiner*—Amy He
(74) *Attorney, Agent, or Firm*—Alston & Bird LLP

(57) ABSTRACT

The invention relates to a sensor which uses the capacitive measuring principle which is used to detect the proximity of a dielectric medium, preferably for detecting a human body part, which is used in an anti-pinching system. The sensor includes a capacitor and an evaluation electronic system. The variation of the capacity of the capacitor, which is caused by the medium, can be measured. The capacitor, which can establish a distinction between a human body part or a solid and water and/or humidity, is characterized in that the capacitor can be operated in a successive manner by at least two different frequencies and/or at least two different pulse duty factors by using the different ratio of said elements in a variable electric field. The invention also relates to a corresponding method.

19 Claims, 2 Drawing Sheets

SENSOR USING THE CAPACITIVE MEASURING PRINCIPLE

CROSS REFERENCE TO RELATED APPLICATION

The present application is a continuation of international application PCT/DE 2005/002105, filed 24 Nov. 2005, and which designates the U.S. The disclosure of the referenced application is incorporated herein by reference.

BACKGROUND OF THE INVENTION

The invention relates to a sensor, which uses the capacitive measuring principle, and a method for detecting an approaching dielectric medium, preferably for detecting a human body part, said sensor being adapted for use in an anti-pinching system, and comprising a capacitor and an evaluation electronic system, it being possible to measure the variation of the capacitance of the capacitor, which variation is caused by the dielectric medium.

Capacitive proximity sensors have been known for a long time from practical experience. They comprise specially designed capacitors, the electric stray field of which is influenced by approaching objects. Non-conductive objects, due to their increased relative permittivity in relation to the ambient air, lead to an increase in the capacitance of the sensor. The variation of the capacitance is dependent on the distance of the object from the sensor, the location of the object in relation to the sensor, the dimensions and relative permittivity of the object. The capacitance of the sensor must be determined for detecting an approaching object. All capacitance-measuring methods known from practical experience to those skilled in the art can be used for this purpose. In most cases, the sensor is a part of a tuned circuit, which is put out of tune by approaching objects or which becomes capable of oscillation only by the presence of an object in the stray field of the sensor, given the suitable dimensions of the tuned circuit. Specially designed proximity sensors can be used particularly advantageously in an anti-pinching system. An example of this is disclosed in the German laid-open patent specification DE 102 48 761 A1 (U.S. Patent Publication No. 2006/0139036).

Due to the high water content in the human body and the very high relative permittivity of water, a human body part in the stray field of a proximity sensor leads to a particularly high measuring effect. However, this helps detect not only the presence of a human body part but also water and/or moisture present in the field of the sensor. This leads to erroneous measurements, particularly when there is rain or fog.

This problem is solved in the patent specification DE 102 48 761 A1 mentioned by comparing the measurement results of several sensors of this type to each other and by adjusting the threshold value of the individual sensors, under the assumption of a uniform water/moisture distribution in the range of the combined sensors and the associated constant increase in the capacitance of all the sensors. However, it is not always possible to ensure the accuracy of this assumption. Furthermore, the use of several sensors with associated evaluation electronic systems results in high costs and the necessity for a mutual compensation of the sensors.

Other approaches known from practical experience provide for the use of additional compensation electrodes, which can attenuate the effects of water and/or moisture in the stray field of the sensor, given the suitable circuit connections and dimensions. However, in this case also, expensive compensation measures are required.

It is therefore an object of the present invention to design and refine a sensor and a method of the type mentioned in the introduction, for detecting an approaching dielectric medium, preferably for detecting a human body part, so as to use a simple construction and ensure a reliable measurement independently of environmental effects, particularly moisture and/or water.

SUMMARY OF THE INVENTION

The above objectives and others are realized according to the invention by providing, in one embodiment, a sensor using a capacitive measuring principle for detecting an approaching dielectric medium, such as a human body part, said sensor being adapted for use in an anti-pinching system, and comprising a capacitor and an evaluation electronic system, wherein a variation of a capacitance of the capacitor caused by the dielectric medium can be measured, and wherein the capacitor can be operated in succession using at least two different frequencies and/or at least two different pulse duty factors. Accordingly, such a sensor is characterized in that the capacitor can be operated in succession using at least two different frequencies and/or at least two different pulse duty factors.

With respect to the method of the invention, the above objectives and others are realized according to the invention by providing in another embodiment, a method for detecting an approaching dielectric medium, such as a human body part, said method being adapted for use in an anti-pinching system, and comprising providing a capacitor and an evaluation electronic system, and measuring with a sensor a variation of a capacitance of the capacitor caused by the dielectric medium, wherein the capacitor is operated in succession using at least two different frequencies and/or at least two different pulse duty factors. Accordingly, a method for detecting an approaching dielectric medium is characterized in that the capacitor is operated in succession using at least two different frequencies and/or at least two different pulse duty factors.

It has been realized according to the invention that by using a discharge process for capacitance measurement, it is possible to utilize definite behavior patterns of individual dielectric media in relation to variable electric fields. It has further been found, according to the invention, that it is possible in this manner to differentiate human body parts and various solid substances such as wood and polyethylene from water and/or moisture.

In the discharge process used according to the invention for capacitance measurement, the sensor is connected to a periodic, time-variable voltage source and the charge on the sensor is measured during those periods in which the output voltage supplied by the voltage source is substantially equal to zero. A conclusion can be drawn from this charge about the capacitance of the sensor, and occurring variations of this capacitance can be detected. It is thus possible to clearly detect dielectric media entering into the stray field of the sensor.

Due to the variation of the frequency and the pulse duty factor of the charging voltage, the course of the electric stray field emitted by the sensor changes over time. The term "pulse duty factor" is meant to connote the quotient of the pulse duration divided by the period duration of a periodic, time-variable voltage. The pulse duration refers to that time interval in which a voltage surge with a random course over time reaches more than 50% of its amplitude.

In a stray field generated by voltages having different frequencies and/or pulse duty factors, different dielectric media show different behavior. Thus the increase in the capacitance of the sensor, which increase is caused by a human body part, is substantially constant in a wide frequency range. The same applies in the case of different pulse duty factors. Many solid substances such as wood and polyethylene show a similar effect as in the case of a human body part. In contrast, water and/or moisture present in the stray field of the sensor causes an increase in the capacitance of the sensor, which increase is dependent on the frequency used and/or the pulse duty factor used.

One cause for this is contained in the dipole properties of water. Since water forms permanent dipoles, orientational polarization can be observed in an electric field. Due to an applied electric field, the individual dipoles are oriented by overcoming their inertia. The degree of orientation depends on the frequency and the duration of the electric field present. The higher the frequency selected, the lesser the reaction (orientation) of the dipoles and the greater the heat development. The shorter the pulse duration, the higher the probability of a dipole not being oriented completely.

By utilizing this effect, it is possible to make a classification of the dielectric media entering into the stray field of the sensor. For this purpose, a group of measurements comprising at least two measurements is performed using at least two different frequencies and/or at least two different pulse duty factors for each of said two measurements. The period of time for performing the measurements is selected advantageously in such a way that possibly occurring parameter changes caused, for example, by changes in moisture distribution or in temperature influences are negligible. Preferably a group of measurements is repeated periodically.

BRIEF DESCRIPTION OF THE DRAWINGS

Figure 1:
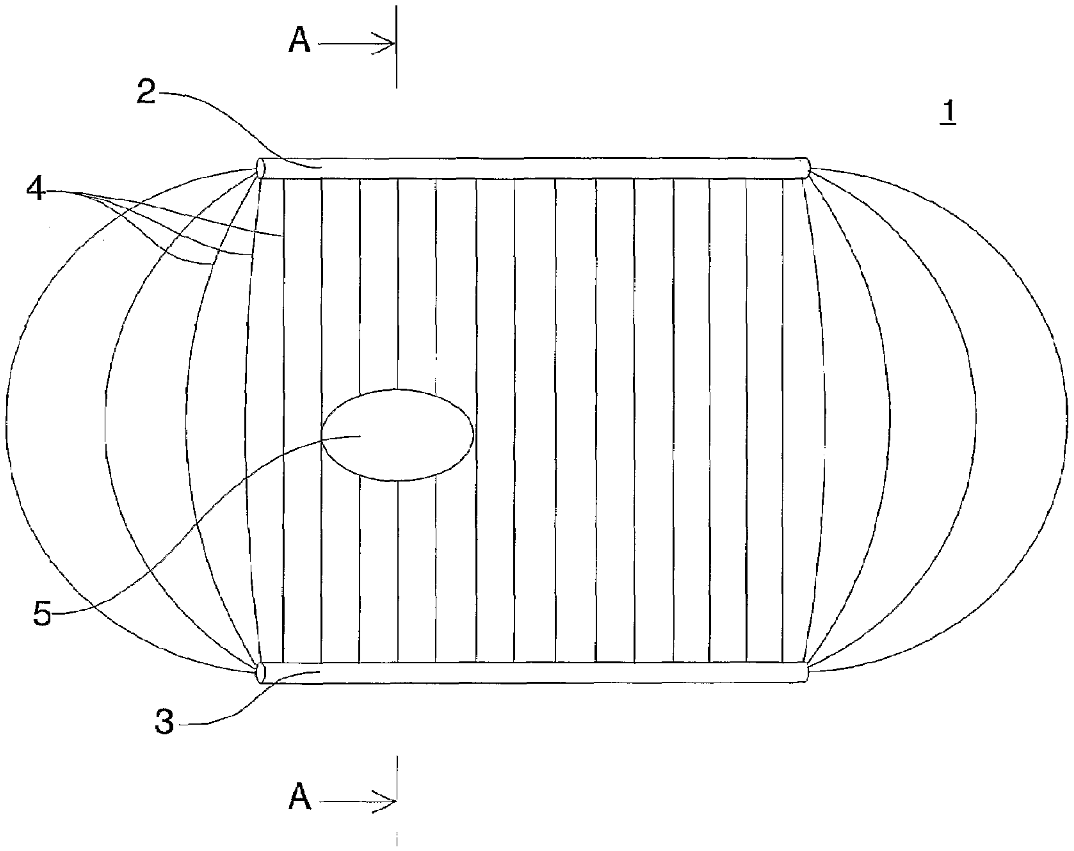
Figure 2:
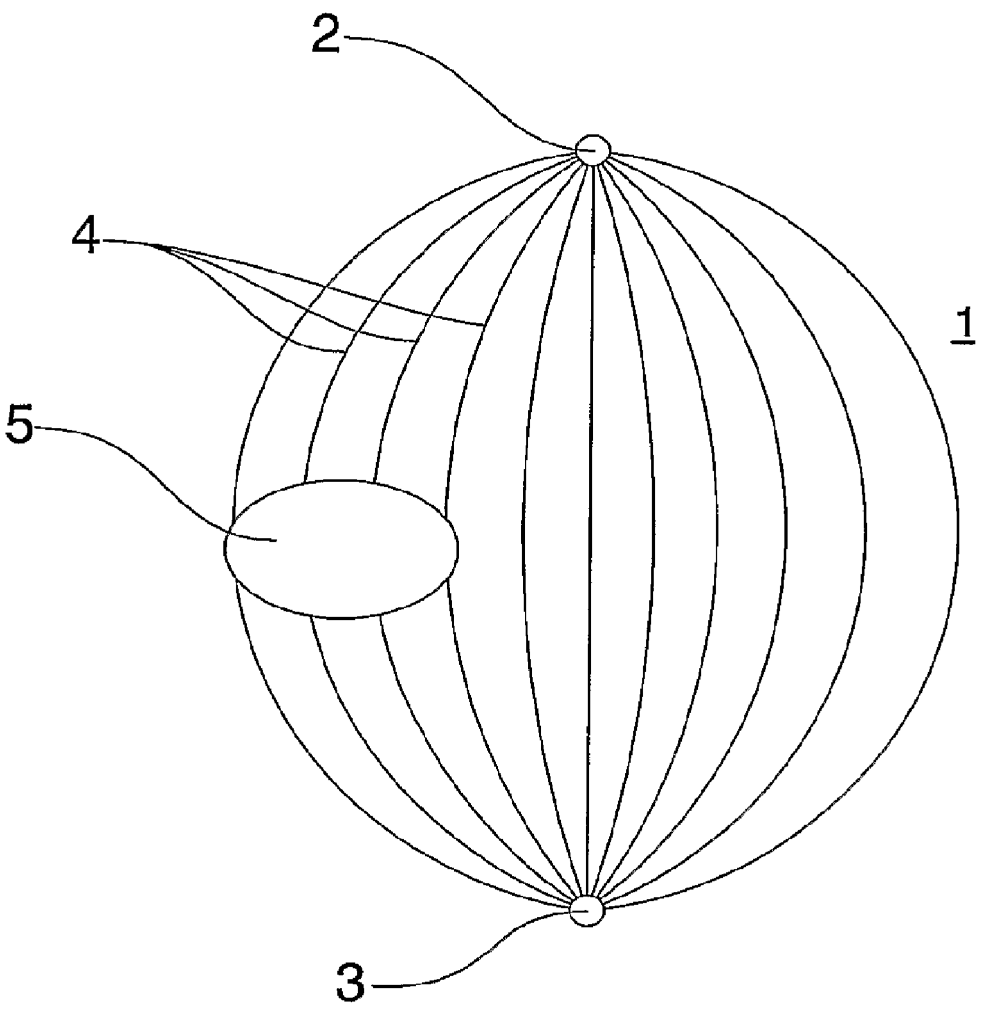

Having thus described the invention in general terms, reference will now be made to the accompanying drawings, which are not necessarily drawn to scale, and wherein:

FIG. 1 is a schematic illustration of the front view of the basic structure of a sensor for detecting an approaching dielectric medium in accordance with one exemplary embodiment of the present invention; and FIG. 2 is a schematic illustration of section A-A shown in FIG. 1.

DETAILED DESCRIPTION OF THE INVENTION

The present invention now will be described more fully hereinafter with reference to the accompanying drawings, in which some, but not all embodiments of the invention are shown. Indeed, the present invention may be embodied in many different forms and should not be construed as limited to the embodiments set forth herein; rather, these embodiments are provided so that this disclosure will satisfy applicable legal requirements. Like numbers refer to like elements throughout.

FIG. 1 and FIG. 2 are schematic illustrations showing different views of a preferred embodiment of the present invention. The capacitor 1 constituting the sensor is formed by two wires 2, 3, which are disposed at a distance from each other and preferably, substantially, parallel to each other. Instead of wires, it is possible to use all comparable conductive structures that are known from practical experience to those skilled in the art, such as, for example, vapor-deposited or glued conductors, conductive polymer layers or the like. The wires 2, 3 are preferably integrated in the seal of a window, a tailgate, a sliding door or similar motor-driven parts of a motor vehicle. In general, however, the apparatus according to the invention can be used for securing all components moving electrically, pneumatically, hydraulically or in any other comparable manner, which involve the hazard of body parts or objects getting pinched or trapped. It would thus be conceivable to equip a revolving door of a department store with the apparatus according to the invention and to stop the rotary motion of the door in a situation in which a body part or object is trapped and to temporarily change the direction of rotation, if appropriate.

The wires 2, 3 forming the capacitor are impinged upon by a voltage source (not shown) preferably with a square wave voltage, the frequency of which can be adjusted preferably in the range of 100 kHz and 10 MHz. In principle, even higher frequencies would be conceivable. In addition, the pulse duty factor of the voltage can be adjusted, it being possible to adjust the frequency and the pulse duty factor preferably independently of each other. It is thus possible to generate, in the capacitor 1 and in the boundary region thereof, an electric stray field 4, which is time-variable and the field lines of which are drawn in FIGS. 1 and 2. A schematically shown dielectric medium 5, which increases the capacitance of the sensor, is present in this stray field 4. This dielectric medium can be, for example, water, moisture, a human body part, a solid body such as wood or polyethylene.

During a measurement, the sensor is charged with this square wave voltage and thereafter the charge on the capacitor is measured at certain time intervals. The measurements are performed using at least two different frequencies and/or pulse duty factors of the charging voltage and are preferably repeated periodically.

A conclusion is drawn about the capacitance of the sensor from the measured charge, and variations of the capacitance in relation to values from previous groups of measurements are determined. If these variations of the capacitance are substantially constant in the case of all the measurements within the current group, it is concluded that a human body part and/or solid matter is present in the immediate vicinity of the sensor. If all the variations of capacitance are different from one another in the case of all the measurements within a current group, it is concluded that there is water and/or moisture, for example caused by rain and/or wet seals, present in the range of the sensor.

Many modifications and other embodiments of the invention set forth herein will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A sensor using a capacitive measuring principle for detecting an approaching dielectric medium, said sensor being adapted for use in an anti-pinching system, and comprising:

a capacitor and an evaluation electronic system, wherein a variation of a capacitance of the capacitor caused by the dielectric medium can be measured, and wherein the capacitor can be operated in succession using at least two different frequencies or at least two different pulse duty factors, wherein a group of measurements comprising at least two measurements is performed using a different frequency or different pulse duty factors of the charging voltage for each of said two measurements, and wherein a conclusion about water entering into a field of the capacitor is drawn, if the variation of the capacitance caused by the dielectric medium takes up different values in the case of all the measurements within a group, or a conclusion about a dielectric medium differing from water entering into a field of the capacitor is drawn, if the variation of the capacitance caused by the dielectric medium is substantially constant in the case of all the measurements within a group.

2. The sensor according to claim 1, wherein the capacitor is formed by two conductive structures, which are disposed at a distance from each other.

3. The sensor according to claim 1, wherein the capacitor is formed by two wires, which are disposed at a distance from each other.

4. The sensor according to claim 3, wherein the wires are disposed substantially parallel to each other.

5. The sensor according to claim 3, wherein the wires are attached to boundaries of a region of parts moving electrically, pneumatically, hydraulically or in any other comparable manner, the region of parts involving a hazard of body parts or other objects becoming pinched.

6. The sensor according to claim 3, wherein the wires are integrated in the seal of a window, a tailgate, a sliding door or similar, motor-driven parts of a motor vehicle.

7. The sensor according to claim 1, wherein the capacitor can be impinged upon with a periodic, time-variable voltage.

8. The sensor according to claim 7, wherein the voltage is a square wave voltage.

9. The sensor according to claim 7, wherein the frequency of the voltage can be adjusted in the range of 100 kHz and 10 MHz.

10. The sensor according to claim 7, wherein a pulse duty factor of the voltage can be adjusted.

11. The sensor according to claim 9, wherein the frequency and the pulse duty factor can be adjusted independently of each other.

12. The sensor according to claim 1, wherein a charge of the capacitor can be measured.

13. A method for detecting an approaching dielectric medium, said method being adapted for use in an anti-pinching system, and comprising:

providing a capacitor and an evaluation electronic system; and measuring with a sensor a variation of a capacitance of the capacitor caused by the dielectric medium, wherein the capacitor is operated in succession using at least two different frequencies or at least two different pulse duty factors, wherein a group of measurements comprising at least two measurements is performed using a different frequency or different pulse duty factors of the charging voltage for each of said two measurements, and wherein a conclusion about water entering into a field of the capacitor is drawn, if the variation of the capacitance caused by the dielectric medium takes up different values in the case of all the measurements within a group, or a conclusion about a dielectric medium differing from water entering into a field of the capacitor is drawn, if the variation of the capacitance caused by the dielectric medium is substantially constant in the case of all the measurements within a group.

14. The method according to claim 13, wherein the capacitor is charged with a square wave voltage.

15. The method according to claim 14, wherein the charge on the capacitor is measured.

16. The method according to claim 15, wherein the charging of the capacitor and the measurement of the charge take place at time intervals spaced apart from each other.

17. The method according to claim 15, wherein a conclusion is drawn about the capacitance of the capacitor from the measured charge.

18. The method according to claim 13, wherein all the measurements of a group are effected in a short timeframe of such type that fluctuations of individual parameters are negligible.

19. The method according to claim 13, wherein the group of measurements is repeated periodically.

* * * * *

UNITED STATES PATENT AND TRADEMARK OFFICE
CERTIFICATE OF CORRECTION

PATENT NO. : 7,545,154 B2
APPLICATION NO. : 11/765612
DATED : June 9, 2009
INVENTOR(S) : Wagner et al.

It is certified that error appears in the above-identified patent and that said Letters Patent is hereby corrected as shown below:

Title page,

Insert the following,

--(30) Foreign Application Priority Data
Dec. 22, 2004 (DE) ......................10 2004 063 108.5
Mar. 21, 2005 (DE) ......................10 2005 013 441.6--.

Signed and Sealed this

First Day of December, 2009

David J. Kappos

David J. Kappos
*Director of the United States Patent and Trademark Office*